United States Patent [19]
Litvin et al.

[11] Patent Number: 5,993,541
[45] Date of Patent: Nov. 30, 1999

[54] PROCESS FOR NUCLEATION OF CERAMICS AND PRODUCT THEREOF

[76] Inventors: Arkadi L. Litvin, 133 Beaconsfield Rd., #46, Brookline, Mass. 02146; Suresh Valiyaveettil, Martin-Luther Strasse-15, 55131, Mainz, Germany; David L. Kaplan, 25 Hollock Point Rd., Stow, Mass. 01775

[21] Appl. No.: 08/690,509

[22] Filed: Jul. 31, 1996

[51] Int. Cl.[6] .......................... C30B 19/12; C30B 29/16; C30B 29/24; C30B 29/58
[52] U.S. Cl. .............................. 117/63; 117/68; 117/927; 117/944; 117/947
[58] Field of Search ............................... 117/11, 68, 917, 117/925, 927, 944, 947, 949, 63

[56] References Cited

U.S. PATENT DOCUMENTS

| | | |
|---|---|---|
| 4,734,533 | 3/1988 | Ungarelli et al. . |
| 4,783,561 | 11/1988 | Pregaglia et al. . |
| 4,795,838 | 1/1989 | Bornengo et al. . |
| 4,816,608 | 3/1989 | Bornengo et al. . |
| 4,846,998 | 7/1989 | Pohl et al. . |
| 4,853,488 | 8/1989 | Ungarelli et al. . |
| 4,886,923 | 12/1989 | Ungarelli et al. . |
| 4,961,823 | 10/1990 | Hirano et al. ............................... 117/71 |
| 5,069,744 | 12/1991 | Borodin et al. ............................ 117/71 |
| 5,302,767 | 4/1994 | Galley et al. . |
| 5,556,463 | 9/1996 | Guenzer ..................................... 117/90 |
| 5,830,270 | 11/1998 | McKee et al. ............................ 117/106 |
| 5,837,053 | 11/1998 | Wang et al. ................................. 117/7 |

OTHER PUBLICATIONS

Sims et al., "Habit Modification In Synthetic Crystals Of Aragonite And Vaterite," J. Chem. Soc., Chem. Commun., 1995, pp. 1031–1032.

Jeffrey et al., "Hydrogen Bonding In Biological Structures," (NY: Springer–Verlag, 1991).

Valiyaveettil et al., "Supramolecular Structures Formed From Hydrogen-Bonded Networks Of 5–Alkoxyisophthalic Acid," J Chem. Soc., Chem. Commun., 1994, pp. 2097–2098.

Weiner et al., "X-Ray Diffraction Study Of The Insoluble Organic Matrix Of Mollusk Shells," FEBS Letters, vol. 111, No. 2, Mar. 1980.

Litvin et al., "Liquid Crystalline Texture In Glycine–Modified Diacetylene Langmuir Monolayers At Room Temperature," J. Phys. Chem., vol. 99, No. 2, 1995, pp. 492–495.

Franke et al., "Crystal Growth In Gels At Elevated Pressures: The Upper Limit Of Temperature For Metastable Formation Of Aragonite," Cryst. Res. Technol., 27 (1992) 3, pp. 295–299.

Okumura et al., "Coprecipitation Of Alkali Metal Ions With Calcium Carbonate," Geochimica et Cosmochimica Acta, vol. 50, pp. 49–58 (1984).

(List continued on next page.)

*Primary Examiner*—Benjamin Utech
*Assistant Examiner*—Donald L. Champagne
*Attorney, Agent, or Firm*—Wolf, Greenfield & Sacks, P.C.

[57] ABSTRACT

A process for controlling the formation of ceramics, achievable under ambient conditions, includes preparing a crystallization medium of a ceramic parent solution and spreading an organic monolayer of a hydrogen-bonded network on the air-liquid interface of the solution. For the formation of aragonite, the process uses an undoped calcium bicarbonate solution and a hydrogen-bonded network with a structural motif approximately matching a calcium ion distance in the a-c plane of aragonite. The aragonite product formed has a [010] axis approximately perpendicular to the monolayer. For perovskite materials, such as BSTO ceramics, the microstructure of the product is controlled by changing different functional groups of the organic monolayer which has been spread on the surface of a perovskite parent solution.

23 Claims, 14 Drawing Sheets

OTHER PUBLICATIONS

Menger et al., "Long Organic Fibers Obtained By Noncovalent Synthesis," J. Am. Chem. Soc. 1994, vol. 116, No. 13, pp. 5987–5988.

Wray et al., "Precipitation Of Calcite And Aragonite," Journal of the American Chemical Society, vol. 79, No. 9, May 7, 1957, pp. 2031–2034.

Holc et al., "Temperature Characteristics Of Electrical Properties Of (Ba,Sr) TiO$_3$ Thick Film Humidity Sensors," Sensors and Actuators, B 26–27 (1995) pp. 99–102.

Heywood et al., "Template–Directed Nucleation And Growth Of Inorganic Materials," Advanced Materials, vol. 6, No. 1, pp. 9–20 (1994).

Mann et al., "Crystallation At Inorganic–Interfaces: Biominerals And Biomimetic Synthesis," Science, vol. 261, pp. 1286–1292, Sep. 3, 1993.

Litvin et al., "Surface Modification Of Biocompatible Substrates For Controlled Bioceramic Coatings" Bioceramics 9, Elsevier Science, Oxford, 1996.

Heywood et al., "Molecular Construction Of Oriented Inorganic Materials: Controlled Nucleation Of Calcite And Aragonite Under Compressed Langmuir Monolayers," Chem. Mater., vol. 6, No. 3, pp. 311–318, 1994.

Fritz et al., "Flat Pearls From Biofabrication Of Organized Composites On Inorganic Substrates," Nature, vol. 371, pp. 49–51, Sep. 1, 1994.

Litvin et al., "Influence Of Supramolecular Template Organization On Mineralization," J. Phys. Chem., vol. 99, No. 32, 1995, pp. 12065–12068.

Kim et al., "Influences Of Indium Tin Oxide Layer On The Properties Of RF Magnetron–Sputtered (BaSr)TiO$_3$ Thin Films On Indium Tin Oxide–Coated Glass Substrate," Jpn. J. Appl. Phys. vol. 32 (1993) Pt. 1, No. 6A, pp. 2837–2841.

Fig. 7A  2.4 μm
Fig. 7B  1.1 μm

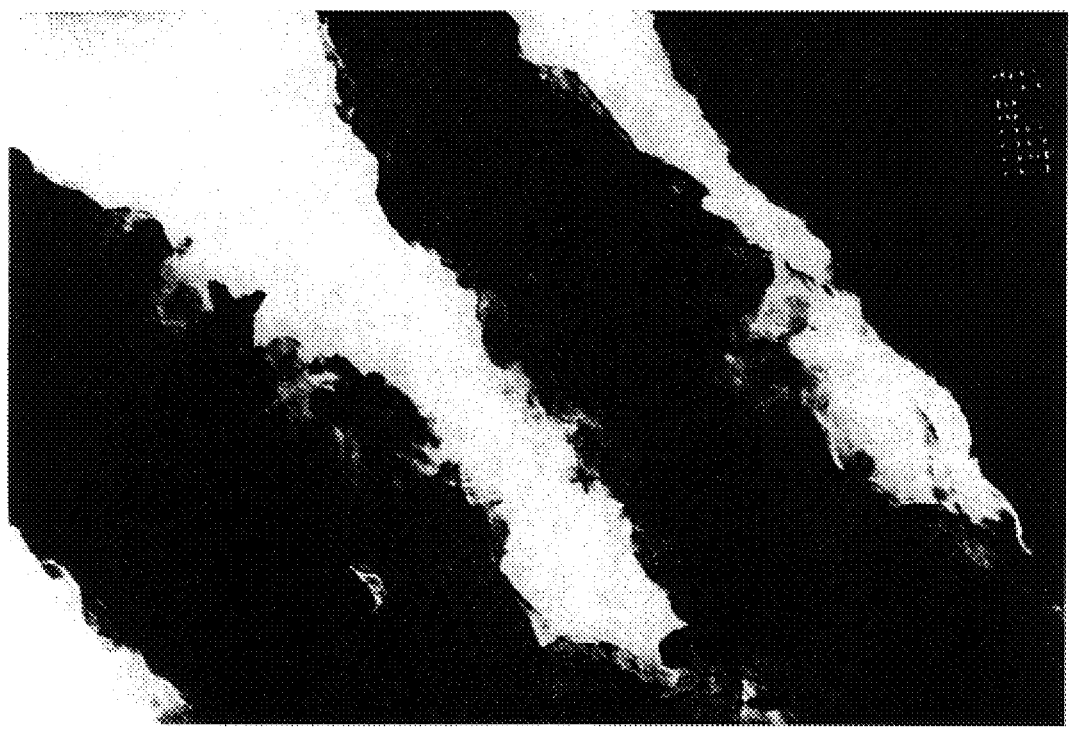
Fig. 8A   48 nm
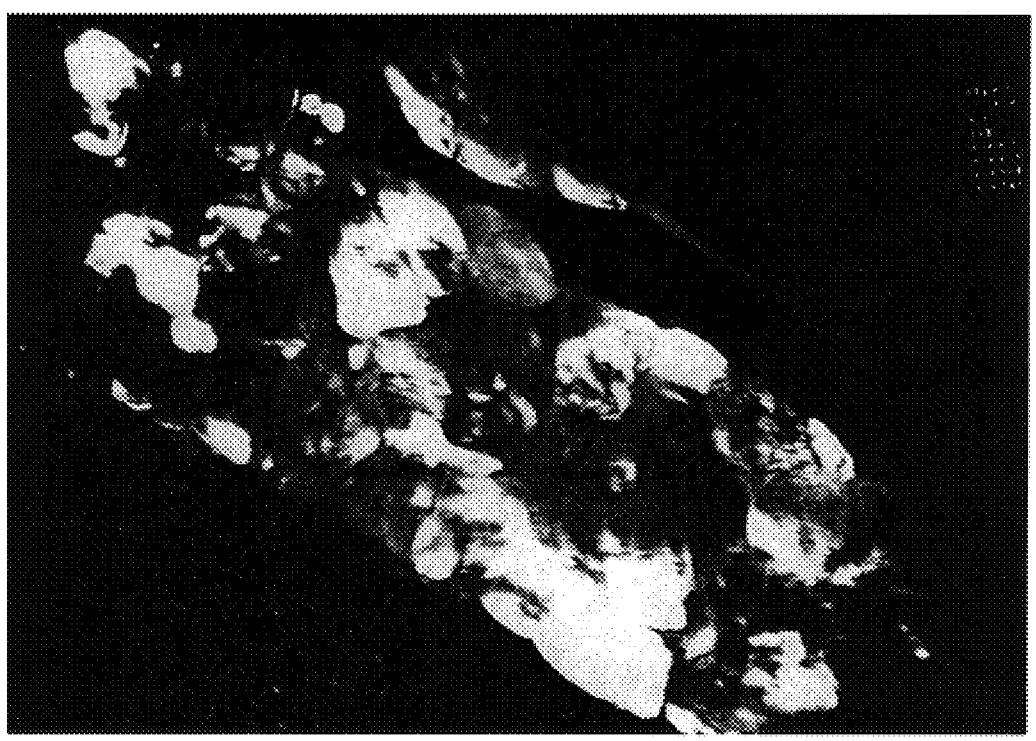
110 nm
Fig. 8B

Fig. 9A  1.1 μm
Fig. 9B  0.63 μm

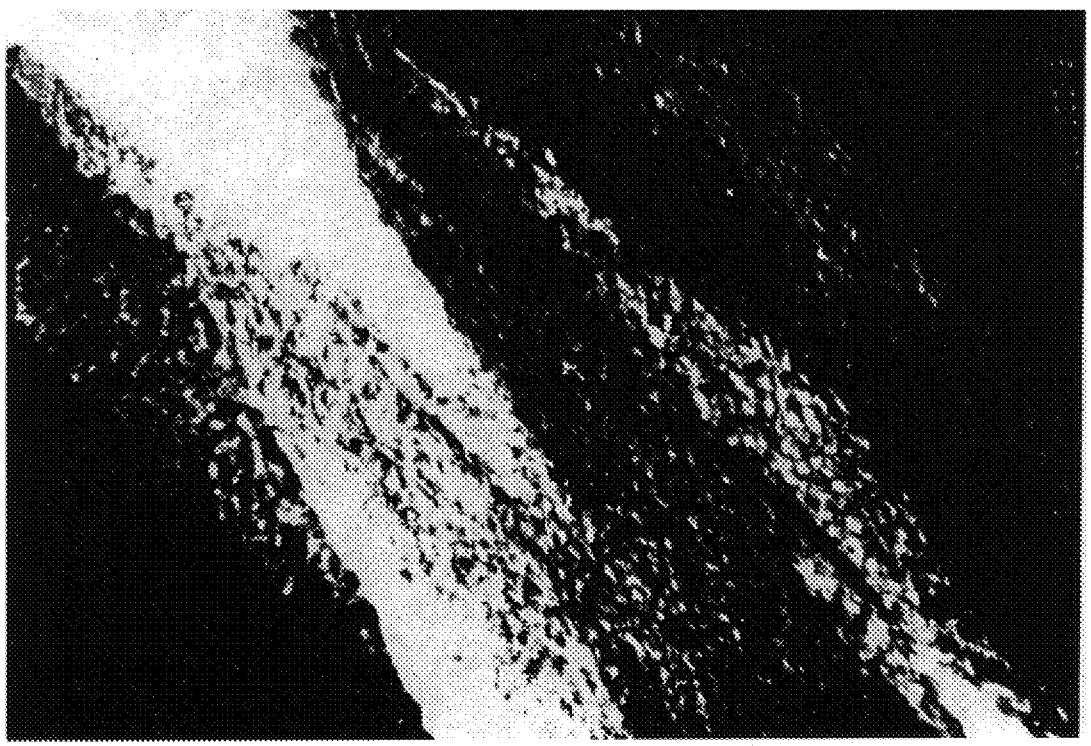
Fig. 10A  63 nm
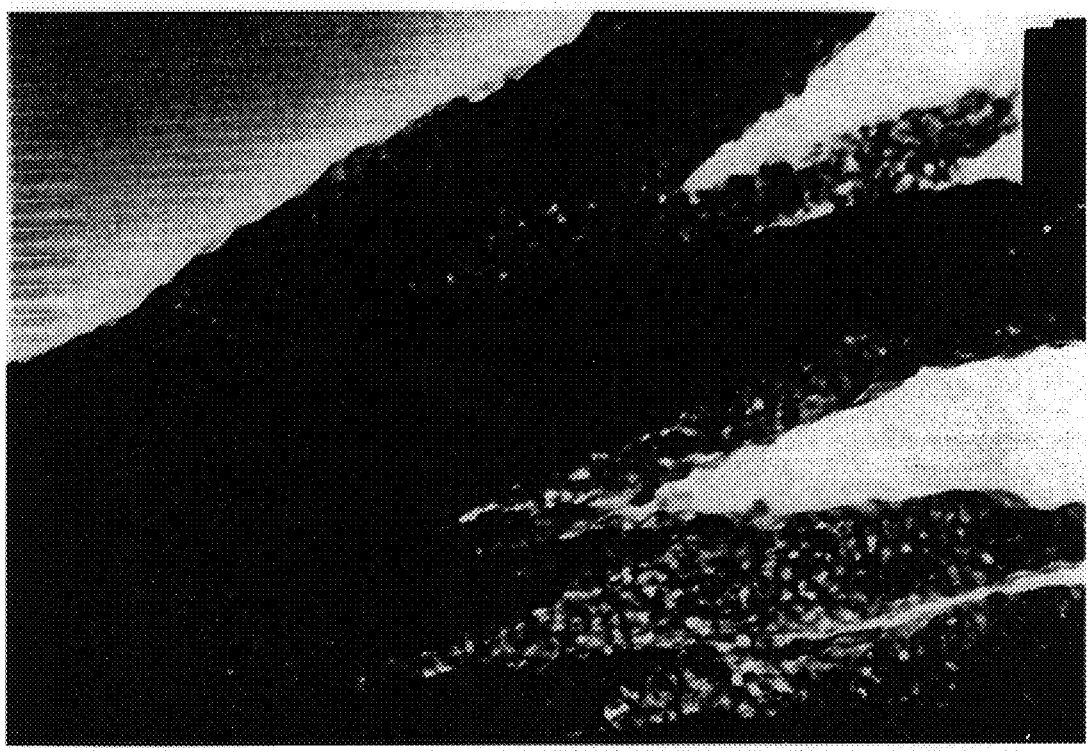
Fig. 10B  63 nm

PROCESS FOR NUCLEATION OF CERAMICS AND PRODUCT THEREOF

FIELD OF THE INVENTION

The present invention relates to a process for the nucleation and growth of ceramics and other crystalline materials which involves the use of tailored organic templates.

BACKGROUND OF THE INVENTION

Modern ceramics include a wide range of materials ranging from single crystals and dense polycrystalline materials through glass-bonded aggregates, insulating foams and wholly vitreous substances. As the need for ceramic materials has grown, so has the desire to control their nucleation and growth, as this will frequently determine the useable properties of the final product.

One of the recent methods for controlling the nucleation and growth of inorganic and organic crystals is the use of supramolecular assemblies composed of organic molecules, which serve as templates, for forming the ceramic or other crystalline structure. This method of control has a direct influence on crystal location, polymorph selectivity, and the microstructure of the crystals formed.

The use of templates also occurs in nature. For example, aragonite is one of a number of calcium carbonate ($CaCO_3$) polymorphs found in nature (e.g., in mollusk shells, human brain stones, gallstones, and the Earth's crust). In mollusk shells, $CaCO_3$ mineralization occurs in an insoluble organic matrix which acts as a template for incipient crystallization. X-ray diffraction analysis has suggested that the organic template assumes antiparallel $\beta$-sheet conformation. More specifically, a close match has been found between the matrix periodicity and Ca—Ca distances in the ab plane of aragonite, particularly along the a axes (4.96 Å and 4.75 Å, respectively) and less of a match along the b axes (7.97 Å and 6.9 Å, respectively). S. Weiner and W. Traub, *X-Ray Diffraction Study of the Insoluble Organic Matrix of Mollusk Shells, FEBS Letters*, Vol. 111, p. 311 (1980).

The synthesis of aragonite has been extensively studied and has been achieved mainly through the introduction of various inorganic and organic additives to calcium-containing solutions and gels. For example, aragonite has been formed in the presence of NaCl and hexametaphosphate or pyrophosphate. Metastable formation of aragonite in gels has been achieved at elevated pressure in a temperature range of 100° to 270° C. in the presence of magnesium ions.

Additives such as Mg, Ni, Co, Fe, Zn, Cu and Li may lead to aragonite growth at ambient conditions, i.e., room temperature and atmospheric pressure. For example, in M. Okumura and Y. Kitano, *Coprecipitation of Alkali Metal Ions with Calcium Carbonate, Geochemica et Cosmochimica Acta*, Vol. 50, pp. 49–58 (1986), the authors describe the use of alkali metal ions ($Li^+$, $Na^+$, $K^+$, and $Rb^+$) and $Mg^{2+}$ ions dissolved in a calcium bicarbonate solution. The solution was stirred at 25° C., until 80–90% of the calcium ions in the solution were precipitated as calcium carbonate, by degassing $CO_2$ from the solution. The calcium carbonate was filtered off, washed and air dried. The crystal form of the calcium carbonate precipitated from the parent solutions was found to be pure aragonite with a small amount of magnesium ions, and pure calcite without magnesium ions. Similarly, in B. Heywood and S. Mann, *Molecular Construction of Oriented Inorganic Materials, Chemical Materials*, Vol. 6, pp. 311–318 (1994), the authors state that the precipitation of aragonite is favored by the presence of $Mg^{2+}$ ions in the crystallization medium.

Litvin et al. have demonstrated the influence of supramolecular diacetylenic template structures on spatial location and morphology of $CaCO_3$ crystals. *Influence of Supramolecular Template Organization on Mineralization, Journal of Physical Chemistry*, Vol. 99, No. 32, pp. 12065–12068 (1995). There, calcium carbonate crystals were grown from a calcium bicarbonate solution in the presence of stearic acid, diacetylene modified by glycine, and hydroxyl ethylamine. The crystal growth occurred under the liquid crystalline template, which was manipulated to control the density of nucleation sites and the morphology of the crystals. The periodic modulations in the template influenced the crystal growth locations, and the local density of the template influenced the polymorph selection.

It is also known to precipitate calcite and aragonite by mixing soluble carbonate solutions containing strontium, barium, or lead with solutions of calcium ions. Pure aragonite was precipitated at temperatures of 50° C. and above. Wray and Daniels, *Precipitation of Calcite and Aragonite, Journal of the American Chemical Society*, Vol. 79, No. 9, pp. 2031–2034 (1957).

Recently, a method has been described for synthesizing hollow porous shells of aragonite that resemble the coccospheres of certain marine algae. In this method, aragonite is prepared from a bicontinuous microemulsion containing a cationic quaternary ammonium surfactant (didodecyldimethyl ammonium bromide), tetradecane, supersaturated calcium bicarbonate solution and $Mg^{2+}$ ions. D. Walsh and S. Mann, *Nature*, Vol. 377, 320 (1995).

Biomineralization studies have been utilized to analyze the controlled fabrication of synthetic materials, such as templated crystals. In Fritz et al., *Flat Pearls From Biofabrication of Organized Composites In Inorganic Substrates, Letters to Nature*, Vol. 371, pp. 49–51 (1994), highly-organized aragonitic nacre—a flat pearl—was biofabricated on disks of glass, mica or $MoS_2$ inserted between the mantle and shell of *Haliotis rufescens* (red abalone). Once a partially ordered calcite layer had been deposited, there was a switch back to the nucleation and assembly of stacks of highly-ordered aragonitic nacre. The presence of an inorganic surface between the mantle and shell, therefore, triggers a change in the nature of the mineral phase.

Most of the competitive methods of aragonite manufacture require the use of high temperature, high pressure, specific additives or other difficult procedures, and even with these methods, the degree of control over inorganic phases is limited. This leads to high processing costs and often results in brittle failure of the product in use due to imperfections or voids left during the nonhomogeneous processing.

As described above, many researchers have studied the process of ceramic growth using thin films or self-assembled monolayers; however, no reports have demonstrated adequate control over crystal morphology. Some researchers have added co-precipitants in order to improve control. Other studies show that oriented nucleation of either calcite or vaterite is dependent on the structural and chemical properties of the monomolecular film (i.e., a film having a thickness the length of one molecule). However, none of the surface active agents (surfactants) studied to date selectively induced nucleation of aragonite unless additives, such as $Mg^{2+}$ ions, were introduced into the supersaturated subphase. Also, all surfactants previously used for mineralization have involved a pseudohexagonal packing in the solid phase. It is important, therefore, to create alternative synthetic pathways for the production of aragonite.

Another class of ceramics which have been extensively studied are the perovskites. Their high electrical and optical properties enable their use in thermistors, high-dielectric capacitors, field-effect transistors, nonvolatile memorys, and high-frequency transducers in the form of a thin film. The perovskite structure is typically in the form: $XYO_3$, with the X atom surrounded by 12 O atoms and the Y atom by 6 O atoms. This structure provides a strong ferroelectric material with a strong electric-dipole moment and therefore enables storage of large quantities of electric energy similar to a capacitor. The material has a large dielectric constant due to the central ion's ability to move within the structure, causing electric poles. Representative perovskite materials include barium titanate ($BaTiO_3$), strontium titanate ($SrTiO_3$), and doped combinations of these materials, collectively known as BSTO's. The ability to control the microstructure, and hence, the physical properties of these materials is of significant importance in the electronics industry. Other structural-dependent classes of materials having the perovskite structure include antiferroelectric materials ($PbZrO_3$ and $NaNbO_3$), ferromagnetic compounds ($LaCo_{0.2}Mn_{0.8}O_3$), and anti-ferromagnetic compounds ($LaFeO_3$).

SUMMARY OF THE INVENTION

In one aspect, the present invention is a process of template formation for nucleating and controlling the formation of ceramics. The general process involves providing a crystallization medium of a ceramic parent solution and forming an organic monolayer (template) having a hydrogen-bonded network on an air-liquid interface of the solution.

According to one embodiment for the production of aragonite, a crystallization medium of undoped calcium bicarbonate solution is provided at room temperature and ambient conditions. An organic monolayer is formed on the air-liquid interface, comprising a hydrogen-bonded network with a structural motif and periodicity approximately matching a cation distance in the plane of the desired product. The aragonite product formed has its [010] axis approximately perpendicular to the monolayer at the air-liquid interface.

The process can be performed without the use of additives, i.e., undoped, in the calcium bicarbonate solution. To form the organic monolayer, a solubilized organic molecule is spread on the surface of a standard trough, and is compressed on the trough surface thereby forming the monolayer. The organic molecule layer forms the hydrogen-bonded network. The monolayer is then deposited on substrates from the undoped calcium bicarbonate solution (subphase).

The supramolecular template may be constructed for example from 5-hexadecyloxyisophthalic acid ($C_{16}ISA$), which enables the nucleation and growth of aragonite at the organic-inorganic interface under ambient conditions without a need for additives. The template has a hydrogen-bonded network with a periodicity matching the Ca—Ca distance in the ac plane of aragonite.

According to a second embodiment, a process is provided for controlling the microstructure of perovskite materials, such as barium-strontium-titanium oxide (BSTO) ceramics, which includes preparing a crystallization medium of a perovskite parent solution, and forming an organic monolayer on an air-liquid interface of the solution. The organic monolayer in this embodiment can be $C_{16}ISA$, octadecylamine, or sphingomyelin. For each of these three organic monolayers, a different microstructure of the BSTO ceramic is formed.

Additional features and benefits of the present invention will be provided by the following detailed description and drawings.

BRIEF DESCRIPTION OF THE DRAWINGS

FIGS. 7A and 7B are TEM photographs of a BSTO product microstructure formed by using $C_{16}ISA$ as the organic template;

FIGS. 8A and 8B are TEM photographs of a single branch of the BSTO product microstructure formed by using $C_{16}ISA$ as the organic template;

FIGS. 9A and 9B are TEM photographs of the BSTO product microstructure formed by using octadecylamine as the organic template;

FIGS. 10A and 10B are TEM photographs of the BSTO product microstructure formed by using sphingomyelin as the organic template;

DETAILED DESCRIPTION

In accordance with a first embodiment of the present invention there is provided a process for controlling the synthesis of aragonite through the use of tailored organic templates. It is shown that by controlling the nature and type of organic template used, the nature of the crystals formed becomes highly controllable and tailorable.

In a first step, there is prepared a crystallization medium of undoped calcium bicarbonate solution having an air-liquid interface. The undoped calcium bicarbonate solution is at ambient conditions, i.e., atmospheric pressure and room temperature (25° C.). An organic compound is spread on the air-liquid interface; a monolayer is formed composed of the organic molecules in a hydrogen-bonded network having a structural motif and a periodicity approximately matching a cation distance in a plane of the aragonite being formed. The cation distance may be that of the ac plane of aragonite. The organic monolayer is preferably an isophthalic acid (ISA), and most preferably 5-hexadecyloxy-isophthalic acid ($C_{16}ISA$).

The undoped calcium bicarbonate solution (subphase) is prepared by purging $CO_2$ for approximately one hour through a suspension of calcium bicarbonate in water. The suspension is then filtered and the $CO_2$ gas is purged again for approximately one-half hour through the suspension. The calcium bicarbonate supersaturated solution has a pH preferably from about 5.8 to about 6.0, and a calcium ion concentration of about 9.0 to 9.5 milliMolar (mM). The organic monolayer is spread on the air-liquid interface of the calcium bicarbonate solution under a pressure of about 10 to 15 mN/m.

The aragonite product can be manipulated and controlled through the hydrogen-bonded network to form under the monolayer with a particular axis located in a particular direction. Preferably, the [010] axis of the product is approximately perpendicular to the monolayer. The entire process can be done under ambient conditions.

In nature, β-sheet-like structures appear to be important in providing the periodicity and stereochemical organization to promote aragonite formation. In contrast to prior art attempts, the present invention has shown that this can be achieved by using a preorganized molecular template which can form specific structural motifs.

Figure 1:
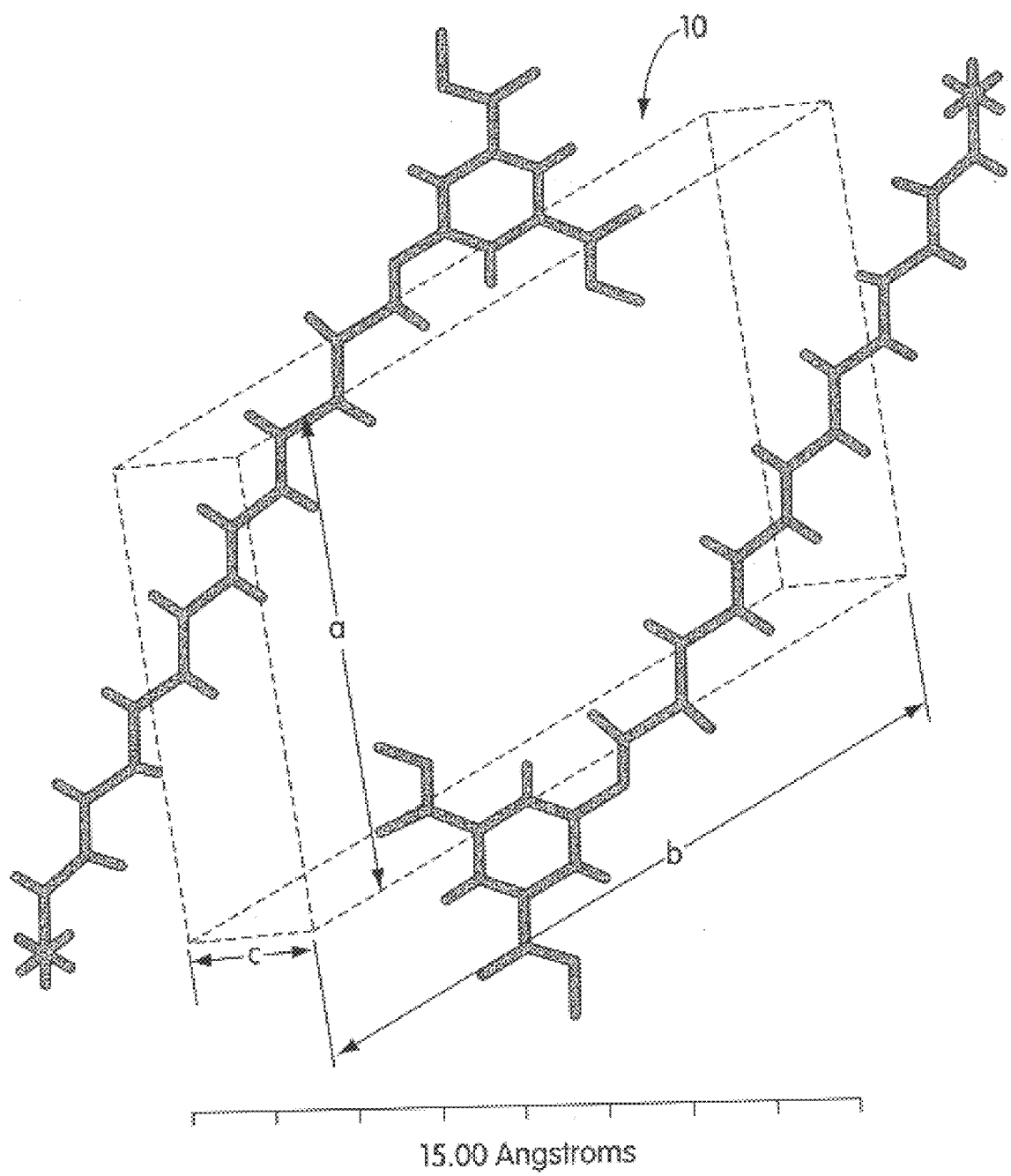
FIG. 1 is a schematic illustration of a $C_{16}ISA$ unit cell, one example of a template for use in the present invention.

In the one embodiment, aragonite is synthesized without additives and under ambient conditions by use of an organic template comprising 5-hexadecyloxyisophthalic acid ($C_{16}ISA$) which assembles into a specific structural motif or periodicity within a Langmuir monomolecular film. This supramolecular organization, without exhibiting a β-sheet-like structure, leads to aragonite formation. Referring to FIG. 1, there is shown schematically a $C_{16}ISA$ unit cell 10 with the dimensions: a=12.124 Angstroms (Å), b=19.573 Å, c=5.425 Å and, with angles of α=90.5, β=91.88, and y=72.31. The $C_{16}ISA$ carboxylate groups are in syn-conformation. It is believed that the periodicity and stereochemical matching between the $C_{16}ISA$ template and Ca—Ca distances in the ac plane of aragonite enables aragonite synthesis under the Langmuir film.

A Langmuir film-forming technique was chosen because it is operable under ambient conditions; other film-forming techniques may also be used. The Langmuir monomolecular film comprises an amphiphilic molecule which is applied and compressed from the sides on a trough to adjust the periodicity.

A model for the $C_{16}ISA$ Langmuir monolayer was built, based on experimental evidence from X-ray crystallography and Fourier transform infrared (FTIR) spectroscopy, and Atom Force Microscopy. A close match was found between the simulated parameters of the template and Ca—Ca distances in the ac plane of aragonite, analogous to the matching observed experimentally by Weiner and Traub from the β-sheet periodicity.

To synthesize aragonite, $C_{16}ISA$ was spread and compressed on the surface of a standard trough to form a monolayer. An undoped calcium bicarbonate solution (pH~5.8–6.0, T=21° C.,$[Ca^{2+}]$=9–9.5 mM) as a crystallization medium was prepared by purging $CO_2$ gas through deionized water for 1 hour, then filtering and purging again for 0.5 hour. The monolayer was deposited on substrates from the undoped calcium bicarbonate subphase. Without intending any limitation, $C_{16}ISA$ was chosen as the organic matrix for a hydrogen-bonded network from the crystallographic data of $C_{12}ISA.EtOH$. See, S. Valiyaveettil, et al., *Supramolecular Structures Formed From Hydrogen-Bonded Networks of 5-Alkoxyisophthalic Acid*, J. Chemical Society, Chem. communications pp. 2097–2098 (1994), especially FIGS. 1–3. The hydrogen-bonded network forms due to the presence of the meta-disposed carboxyl groups of the $C_{16}ISA$ benzene rings. This provides a preorganized supramolecular motif significantly different from the pseudohexagonal lattices of conventional surfactants used previously to induce the nucleation of inorganic crystals at monolayer-solution interfaces.

Hydrogen-bonded networks are common in nature. For example, DNA utilizes double chain hydrogen-bonding, and protein molecules involve hydrogen-bonded β-sheets. Protein structures, however, cannot be applied to the water surface since they are water soluble. Therefore, hydrogen-bonded networks other than protein are preferred for the present invention, and in particular, water compatible structures which do not change due to water. It is not of interest, therefore, to focus on all organic molecules which might work in bulk, but rather only on those with success at the air-liquid interface since this provides the freedom to adjust the crystal plane distance.

In order to grow a specific crystal plane, a periodicity derived from the supramolecular template is required. From the prior art, pseudohexagonal surfactants are typically 5 Å by 5 Å and provide no variation in distance. The hydrogen-bonded network of this invention allows a greater degree of freedom to provide a more variable periodicity.

In prior studies amphiphilic molecules were used as templates on calcium bicarbonate solution under similar conditions and it was noted that these templates promoted nucleation and growth of calcite, vaterite or mixed phases. Monolayers used in previous studies were formed from: $CH_3(CH_2)_{16}COO^{31}$, $CH_3(CH_2)_{17}NH_3^+$, $CH(CH_2)_{19}OSO^-$, $CH_3(CH_2)_{19}PO_3^{-2}$, $CH_3(CH_2)_{17}OH$, $C_{27}H_{45}OH$. See S. Mann, et al., *Crystallization at Inorganic-Organic Interfaces: Biominerals and Biomimetic Synthesis*, Science, Vol. 261, pp.1286–1292 (1993). All of these surfactants have pseudohexagonal packing in the "solid phase," and therefore, unlike the surfactants of the present invention, do not provide any variation in periodicity.

$C_{16}ISA$ is preferred since the hydrogen bonds in amino acid crystal structures, as a natural product, show the same characteristics as in the carboxylic acids. The hydrogenbond lengths in amino acid crystal structures range from 1.439 Å to 2.059 Å, while the hydrogen-bond lengths in carboxylic acids range from 1.399 Å to 2.008 Å. G. A. Jeffrey and W. Saenger, *Hydrogen Bonding in Biological Structures*, Springer-Verlag, Berlin, 1991 p. 114–116 (1991).

Figure 2A:
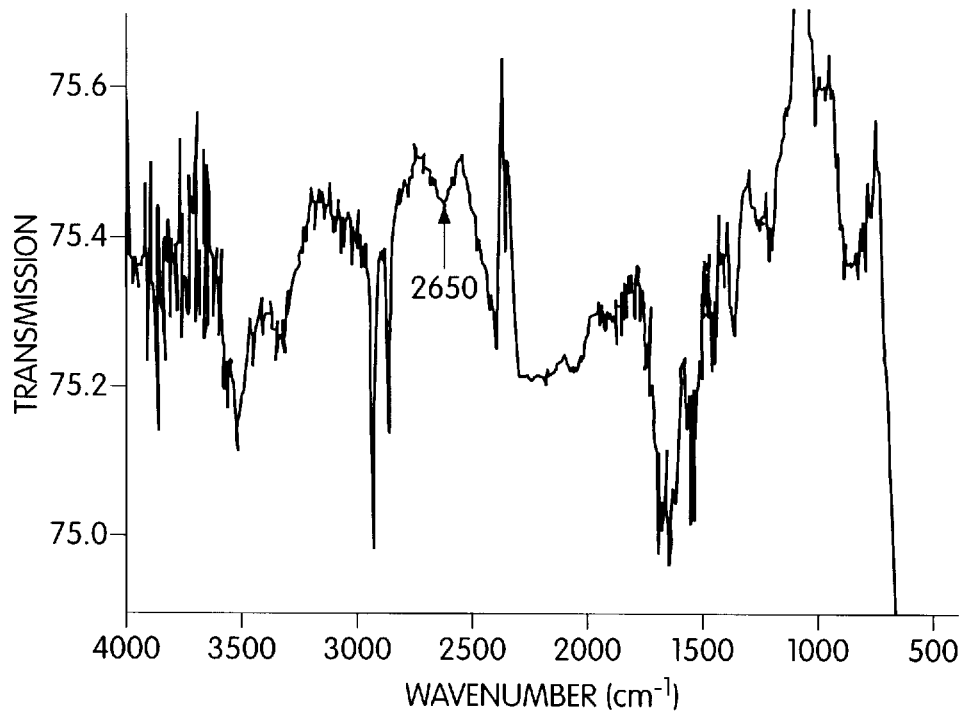
FIG. 2A is an FTIR spectral graph of a $C_{16}ISA$ monolayer deposited on ZnSe slides from a water subphase.
Figure 2B:
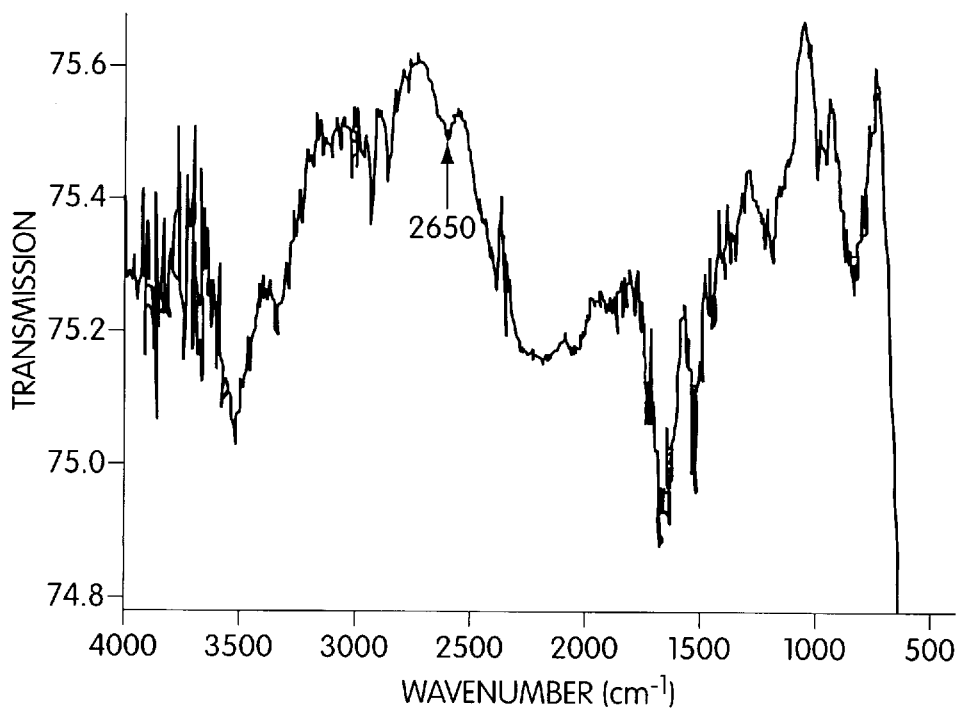
FIG. 2B is an FTIR spectral graph of a $C_{16}ISA$ monolayer deposited on a substrate from a calcium bicarbonate subphase.

FTIR spectroscopy was used to investigate the hydrogen-bonding in these networks within the $C_{16}ISA$ monolayer. FIG. 2 shows the FTIR spectra of a $C_{16}ISA$ monolayer deposited on ZnSe slides from de-ionized water (FIG. 2A) and from a calcium bicarbonate subphase (FIG. 2B). The calcium-containing subphase had a pH of about 5.8–6.0 at a temperature of 21° C., and a calcium ion concentration of about 9.0–9.5 mM. FTIR spectra of samples were collected in the transmission mode at 45 degree incidence with s and p polarization using a Perkin-Elmer 1760 FTIR-FT Raman spectrophotometer. Broad bands from the OH-groups were observed at 2650 $cm^1$, which indicate hydrogen bonding between the carboxylic acids and water.

Under the template, $CaCO_3$ crystal formation was visible in mature stages (t=12 hours, 80 μm.) of synthesis. Scanning electron microscopy (SEM), transmission electron microscopy (TEM) and X-ray diffraction (XRD) were used to identify $CaCO_3$ polymorph and nucleation.

Figure 3A:
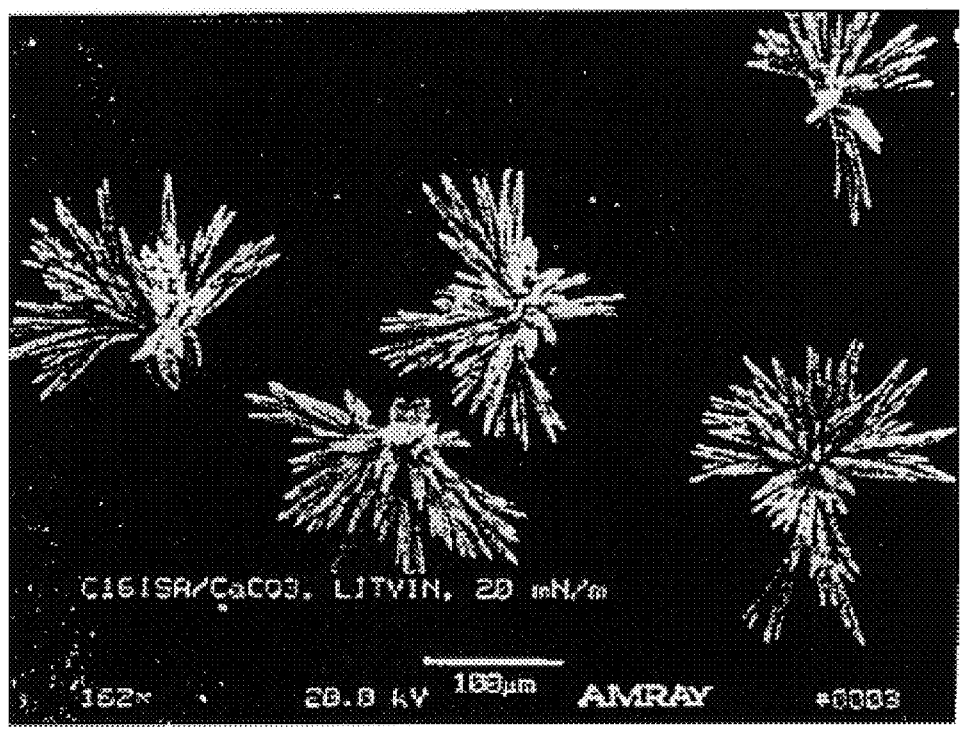
FIGS. 3A and 3B are SEM images of aragonite grown under the $C_{16}ISA$ supramolecular structure (template)
Figure 3B:
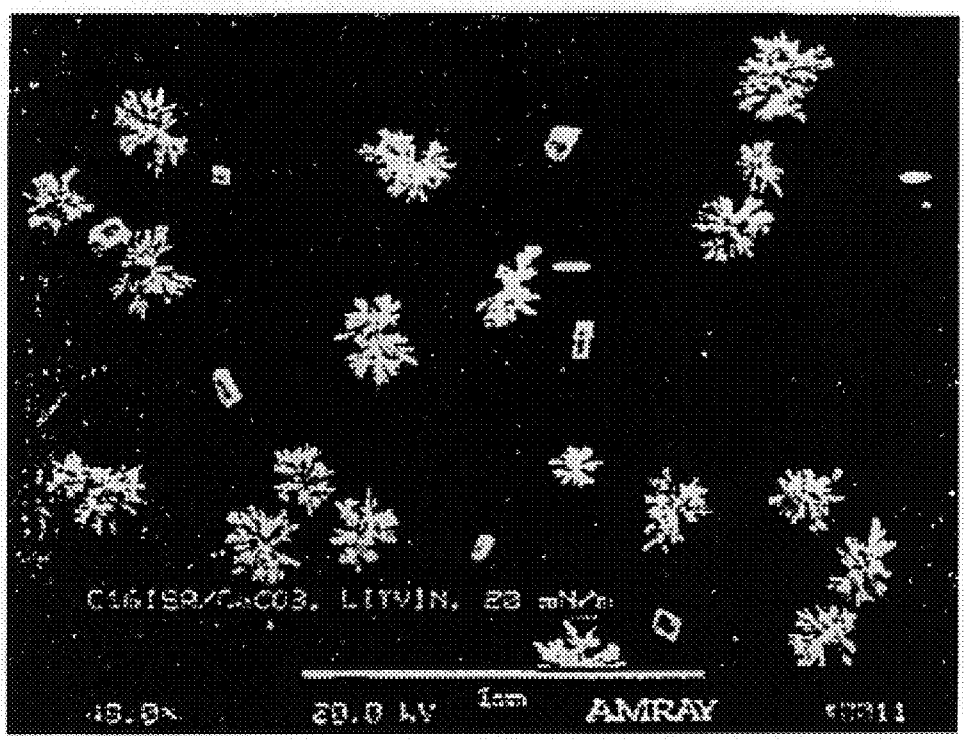

FIGS. 3A–3B are SEM micrographs of the $CaCO_3$ crystals grown under compressed $C_{16}ISA$ monolayers at different resolutions (100 μm and 1 mm respectively). Calcium carbonate crystals were deposited on aluminum SEM stubs at the monolayer-subphase interface. The stubs were coated with a thin layer of gold (about 100 Å) under vacuum to minimize charge on the samples. Needle-like aragonite crystals were observed in discrete 100 micrometer bundles which developed from a common axis or central crystallite which was in direct contact with the monolayer surface. The primary crystals grew to approximately 10 micrometers in size before secondary nucleation of the crystalline needles gave rise to a splayed outgrowth into the supersaturated solution. The early stages of crystal growth were investigated by studying samples extracted after 5 to 15 minutes of crystallization at the monolayer-subphase interface. Transmission electron microscopy (TEM) micrographs showed incipient crystals as tablets with roughened edges.

Figure 4A:
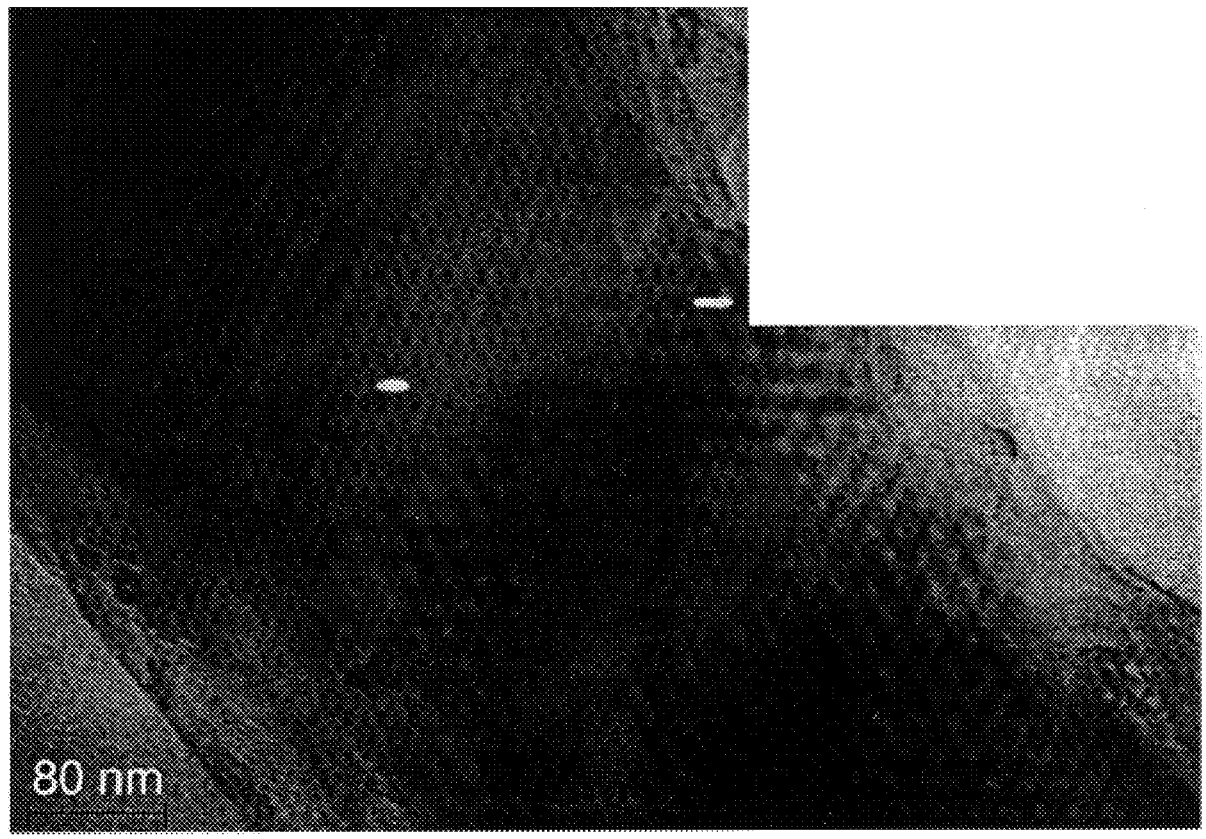
FIG. 4A is a TEM micrograph of an immature aragonite crystal nucleated under a compressed $C_{16}ISA$ monolayer.
Figure 4B:
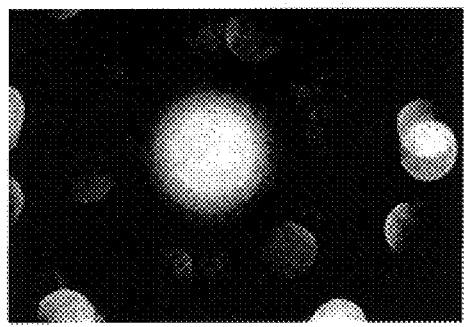
FIG. 4B is an electron diffraction pattern corresponding to the [010] zone of the aragonite crystal.

FIG. 4A is a TEM micrograph of immature aragonite crystal nucleated under compressed $C_{16}ISA$ monolayer after 7 minutes. Selected area electron diffraction patterns recorded from individual particles suggest that the nucleated aragonite crystals were oriented with the [010] crystallographic axis approximately perpendicular to the monolayer surface. This can be seen in FIG. 4B (resolution of 80 nm), which is an electron diffraction pattern of the crystal in the micrograph of FIG. 4A. The pattern corresponds to the [010] zone of aragonite. The reflections give A=102 (1.798 Å), B=102 (1.798 Å), C=200 (1.798 Å). The angles were: (102) ^ (102)=119.9 degrees; (102) ^ (200)=59.95 degrees. The crystal structure of aragonite was shown with Pmcn(62): a=4.96 Å, b=7.967 Å, c=5.74 Å. A Philips EM400T transmission electron microscope was used for low and high resolution imaging. Individual crystals were studied by convergent beam electron diffraction. The data suggest that aragonite is nucleated specifically from the ac crystal face.

After 12 hours, a white sheet of $CaCO_3$ crystals was visible under the $C_{16}ISA$ monolayer. X-ray diffraction of samples collected from the surface confirmed that the main phase (~95% of crystals) is aragonite (observed d-spacings in Å:3.40 (111), 3.28 (021), 2.88 (002), 2.74 (121), 2.71 (012), 2.49 (200), 2.41 (031), 2.38 (112), 2.34 (130), 2.33 (022), 2.19 (211), 2.11 (220), 1.98 (221), 1.88 (202)). In addition, energy dispersive X-ray analysis detected no foreign ions in the crystals. By comparison, crystals grown in the absence of the monolayer were predominantly calcite. The specificity for aragonite nucleation was highly sensitive to the structural nature of the monolayers. For example, the highest nucleation density of aragonite (12+/−3 per $mm^2$) was observed under monolayers compressed within the pressure range of 10–15 mN/m, although no limitation is intended by this and any pressure by which the surfactant forms the desired template structure can be used. This was consistent with atomic force microscopy (AFM) studies which showed a well-defined uniform $C_{16}ISA$ monolayer deposited on hydrophilic silicon substrate at this surface pressure. In contrast, broken $C_{16}ISA$ monolayers were deposited at 20 mN/m, although this pressure is well below the collapse point.

Figure 5:
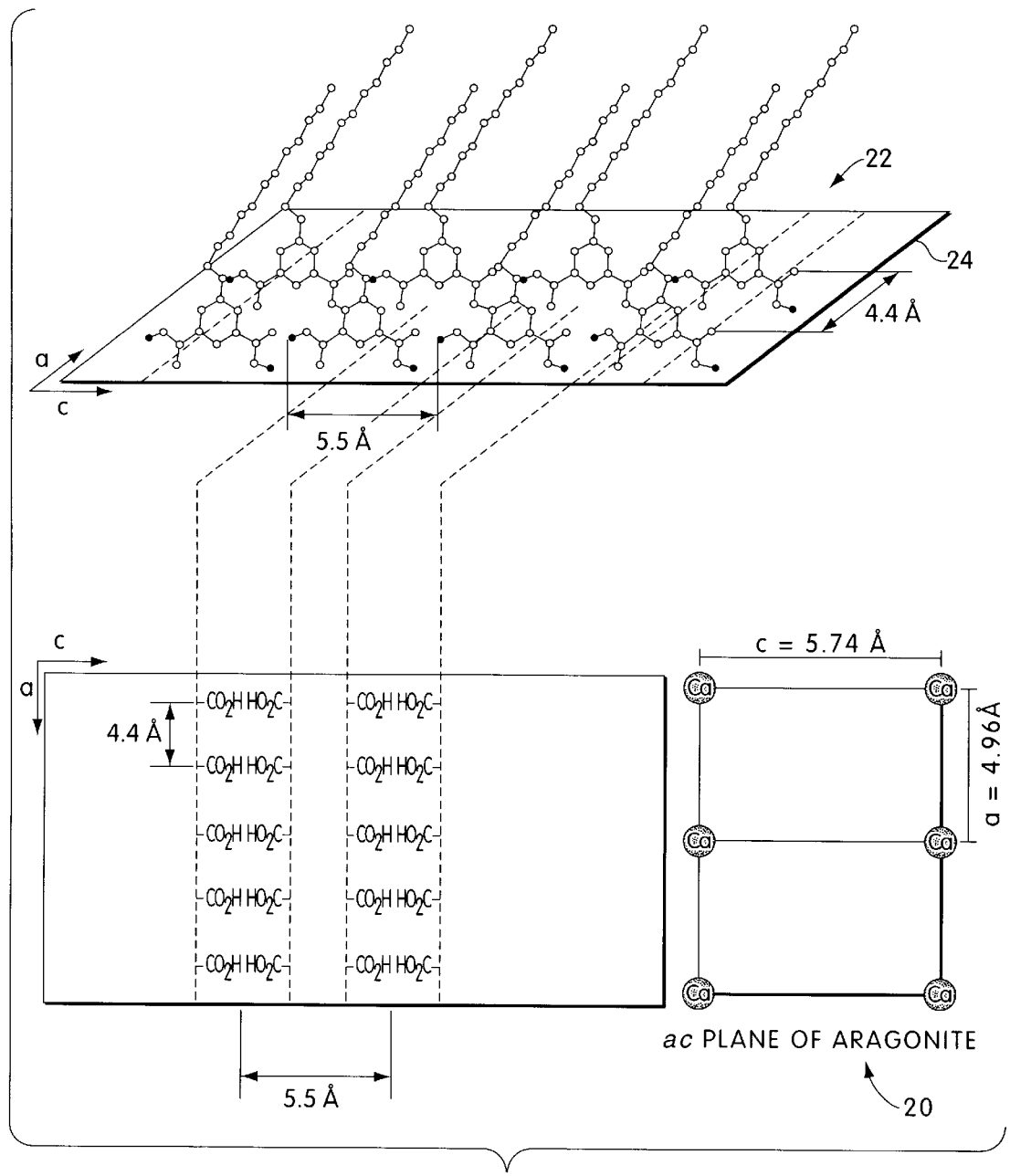
FIG. 5 is a schematic drawing of the spatial relationship between the $C_{16}ISA$ supramolecular periodicity and the ac plane of aragonite.
Figure 6A:
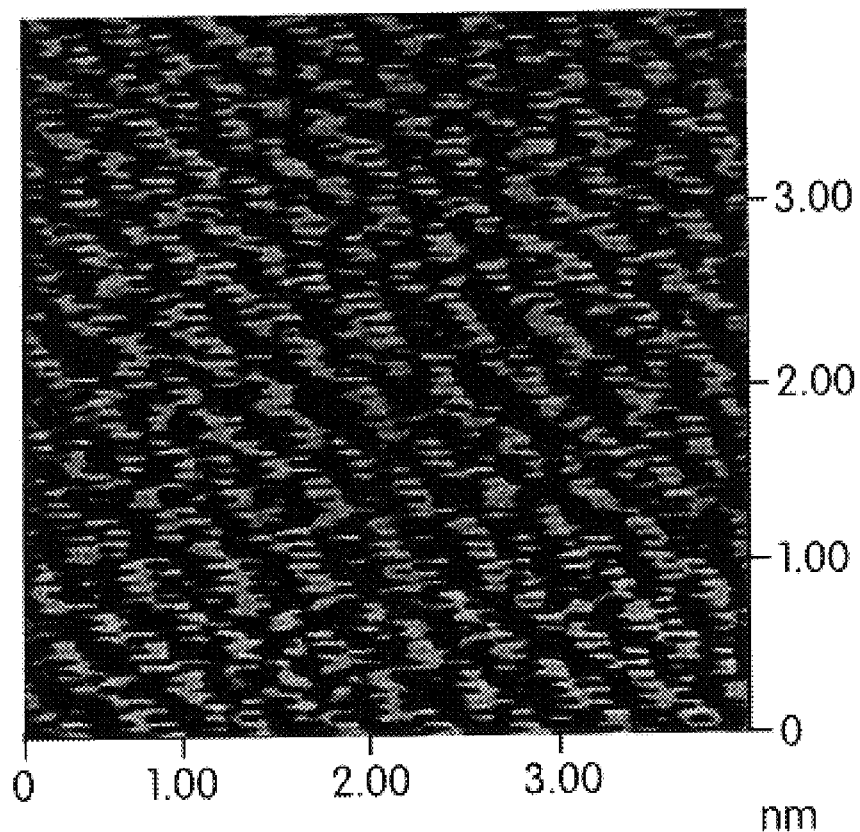
FIG. 6A is an an atomic resolution micrograph of a $C_{16}ISA$ monolayer deposited at 10 mN/m on a hydrophilic silicon substrate.
Figure 6B:
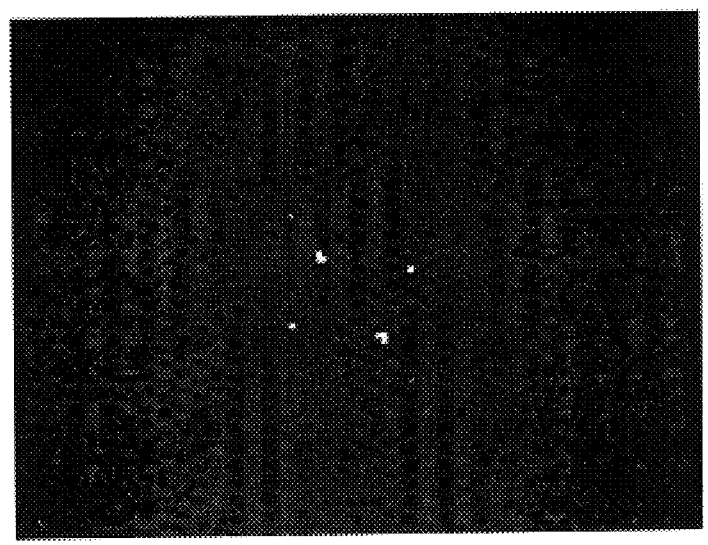
FIG. 6B is a Fourier transform image of a $C_{16}ISA$ monolayer.

To clarify the role of the $C_{16}ISA$ template in mineralization, the structure of this organic matrix was simulated. Referring to FIG. 5, there is shown a schematic drawing of the spatial relationships between $C_{16}ISA$ supramolecular periodicity and the ac plane of aragonite 20. The $C_{16}ISA$ monolayer model 22 was constructed based on the crystal structures of $C_{12}ISA.EtOH$ and $C_{14}ISA.H_2O$. In this model, each molecule resides in a rectangular lattice 24 and interacts with two of its neighbors along the c direction through hydrogen bonding, and with two other molecules via van der Waals forces along the a direction. The experiment was carried out at a pH range of 5.8–6.0; at this pH range, one of the $C_{16}ISA$ carboxyl groups is deprotonated and the other one is not. Atom force microscopy images at atomic resolution of a $C_{16}ISA$ monolayer deposited at 10 mN/m on a hydrophillic silicon surface (FIG. 6A) showed that the arrangement of $C_{16}ISA$ molecules within the monolayer resulted in periodic domains of carboxyl groups spaced at 4.4 Å and 5.5 Å along the a and c directions, respectively. These measurements are in good agreement with synchrotron x-ray diffraction studies of monolayers of a long-chain alkyl surfactant with an aromatic headgroup and with the stacking of flat aromatic organic molecules within 3-D crystals (4.7 Å). FIG. 6B displays a Fourier transform image of the monolayer shown in FIG. 6A.

Surface pressure-area isotherms for $C_{16}ISA$ monolayers compressed on either water or calcium bicarbonate solution were identical (data not shown). Similarly, Brewster Angle Microscopy data also showed that self-assembly of the $C_{16}ISA$ monolayer was not influenced by $Ca^{2+}$ ions in the subphase (data not shown). These results, although contrary to previous work for other surfactant monolayers in which a significant increase in area per molecule (~4.5–5.0 $Å^2$) was recorded in the presence of $Ca^{2+}$- containing subphases, indicate that the structural network of the $C_{16}ISA$ monolayer is preorganized due to H-bonding between the carboxylic acid groups on $C_{16}ISA$ molecules. The head groups occupy a relatively large molecular area in the packed array such that $Ca^{2+}$ ions can be accommodated without significant changes in intermolecular distances (4.4 Å and 5.5 Å).

This observation implies that in the case of the $C_{16}ISA$ template there is a different mechanism of $Ca^{2+}$ interaction to the functional groups in the organic matrix in comparison to the prior study. In this case, the meta-disposed carboxyl groups of $C_{16}ISA$ facilitate a periodic domain formation and functionalities at the air-water interface. Without intending any limitation, two mechanisms are plausible: carboxylate groups of individual molecules form double-chelate complexes with $Ca^{2+}$; or cooperative (involving at least two ligands) interaction of carboxylate groups of different molecules on $Ca^{2+}$ ions.

In both cases, the model gives a close match between the experimental parameters of the $C_{16}ISA$ template and Ca—Ca distances and angles in the ac plane of aragonite (FIG. 5), suggesting that geometric correspondence is important in determining polymorph selectivity. A further possibility is that the bidentate motif of the metadisposed carboxylates complements the stereochemical arrangement of the carbonate anions in the ac face. In this regard, it is noted that in the presence of $Mg^{2+}$ ions, long chain alkyl sulfate or phosphonate monolayers induce nucleation of the (001) (ab) face of aragonite, possibly by correspondence between the tri-dentate headgroup and planar carbonates of this face.

The present invention is useful where control of homogeneity and size of crystals is important for performance, such as ceramic engines or electronic parts. For example, the military requires helicopter seat protection, electronic parts and tank armor. The enhanced control of ceramic particles will improve the mechanical performance of these materials.

In addition, lighter-weight armor plates for personal protection are envisioned that would otherwise be too heavy or bulky to consider. Improved filtration for field drinking water supplies will also benefit from this type of control. Ceramic additives, such as calcium carbonate polymorphs for paper-making, would also benefit from controlled aragonite sizes and shapes to improve whiteness, mechanical integrity and surface properties. Finally, in biomedical implants, control of aragonitic improves surface repair and bone repair by improving mechanical performance and interfacial adhesion.

The process described above can be extended to other ceramics, including the perovskite structured materials, such as barium strontium titanium oxide (BSTO) and some inorganic oxides with the use of a perovskite parent solution as the crystallization medium. In BSTO synthesis, various functional groups in the organic matrix influence the crystal microstructure of the final BSTO product. The different functional groups in the organic matrix lead to different crystal microstructure features which have different mechanical and functional properties for the final product, e.g., conductivity. Additionally, the formation of molecules inhibitory to specific crystal bases allows for an additional level of control to force the crystal growth into two dimensions. This may improve the mechanical and/or functional performance.

BSTO is a ferroelectric material with a high-dielectric constant and is one of the main constituents of thermistors, capacitors, field-effect transistors, non-volatile memorys, high-frequency transducers (thin films), and thick-film humidity sensors.

The BSTO parent solution as a crystallization medium was prepared using known wet chemistry techniques under ambient conditions. An organic monolayer was formed on the air-liquid interface of the solution, from an organic molecule with a supramolecular structure which forms a hydrogen-bonded network. Three different types of functional groups were utilized: (a) $C_{16}ISA$; (b) octadecylamine; and (c) sphingomyelin. Each of these three groups gave a different microstructure and thus different properties to the final BSTO product.

For preparation of the BSTO parent solution, the starting reagents included the following compounds: $TiO_2$ powder, produced by Nanophase Technologies, Inc. with an average grain size of 38 nanometers; and $Ba(OH)_2 \cdot 2H_2O$, $Sr(OH)_2 \cdot 2H_2O$, or $Ba(NO_3)_2$, $Sr(NO_3)_2$. In order to render the $TiO_2$ soluble, the pH of the solution was raised either by the barium and strontium hydroxides alone or by additions of KOH, $NH_4OH$, or a strong organic base such as tetramethylene ammonium hydroxide (TMAH).

The solutions were prepared by first boiling Milli-Q water of about 200–300 ml in order to drive off the dissolved $CO_2$ and then placing it in a beaker with a magnetic stirrer. The pH of the solution was monitored using a Corning Model 240 pH meter and combination electrode with the system being calibrated prior to each run. After purging the head space with $N_2$, a parafilm cover was applied and secured by an elastic band. The reagents in their powdered form were weighed and rapidly transferred to the water. The pH of the thin slurry solution was determined before and after each reagent was added to determine if the solution had been exposed to any external pH modification. All pH modifiers were in liquid form and were added through the parafilm by a needle and syringe, while occasionally repurging the head space with $N_2$. After the pH had stabilized to about 12 to 13, the stirring was stopped and the slurry solids were allowed to settle briefly. The bulk of the sample, including the suspended fines, was then transferred to a glass Millipore film setup, purged with $N_2$ again, and filtered under aspirator suction with a slight nitrogen pressure. The solution was filtered for a total of three times. The three filterings were necessary because of the fine crystal formation on the filtrate's surface, which was due to brief exposure to the $CO_2$- bearing air.

The BSTO solution was placed in two dishes and in a Langmuir-Blodgett Nima trough. One dish was kept without an organic monolayer (as a control sample in each test), and all experiments were carried out at room temperature. In each of the experiments, a different functional group of either $C_{16}ISA$, octadecylamine, or sphingomyelin was used with the organic monolayer.

The TEM photographs of these three products can be seen in FIGS. 7 through 10. The photographs show that for all three organic functional groups, the same polymorph was formed as a final product. This polymorph, however, had a different morphology and a different texture for each of the three different functional groups which were used as the organic template. FIGS. 7A–7B depict the BSTO microstructure formed by using $C_{16}ISA$ as an organic template. A close-up of this grain structure is shown in FIGS. 8A–8B. FIGS. 9A–9B depict TEM photographs of the BSTO microstructure formed by using octadecylamine as the organic template. Similarly, FIGS. 10A–10B depict the BSTO product microstructure formed by using sphingomyelin as the organic template. The grain size of the different microstructures ranges from a large particle of 1 micrometer, to a size of 20 nanometers for the smaller particles of BSTO.

Figure 11:
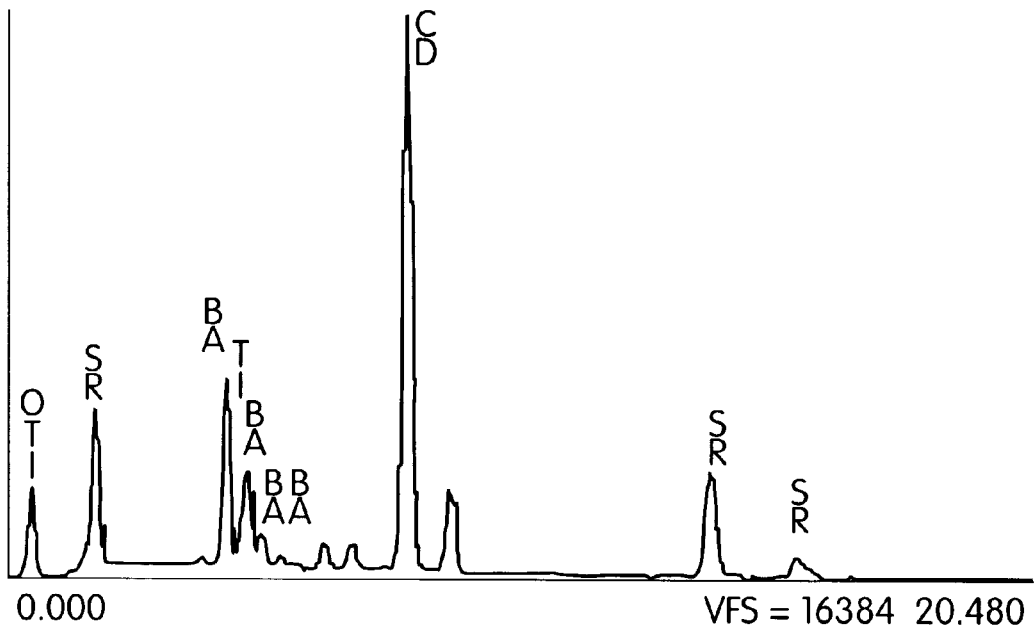
FIGS. 11–12 are energy dispersive X-ray spectra for BSTO products formed by using $C_{16}ISA$ and octadecylamine as the organic template, respectively.
Figure 12:
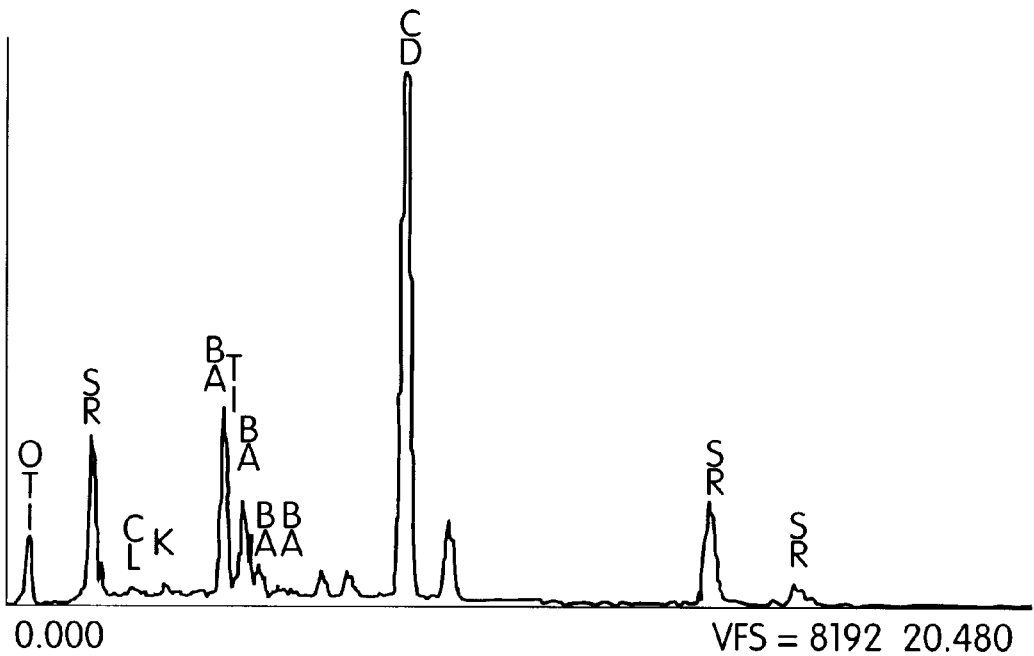
Figure 13A:
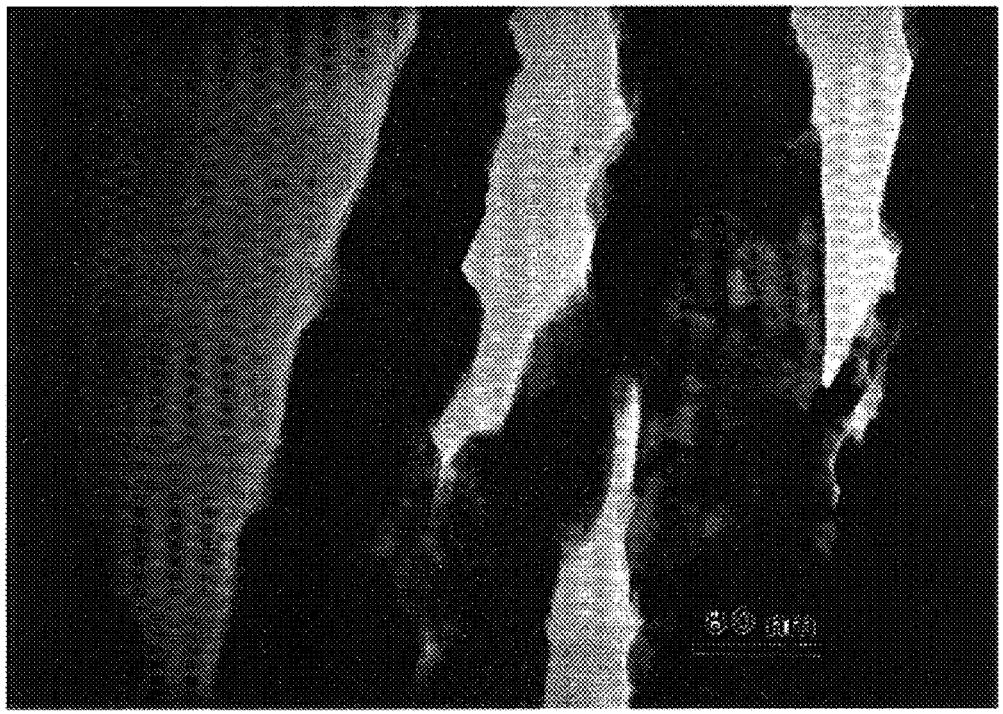
FIGS. 13A–13B are TEM photographs of the BSTO product microstructure formed by using $C_{16}ISA$ as the organic template.
Figure 13B:
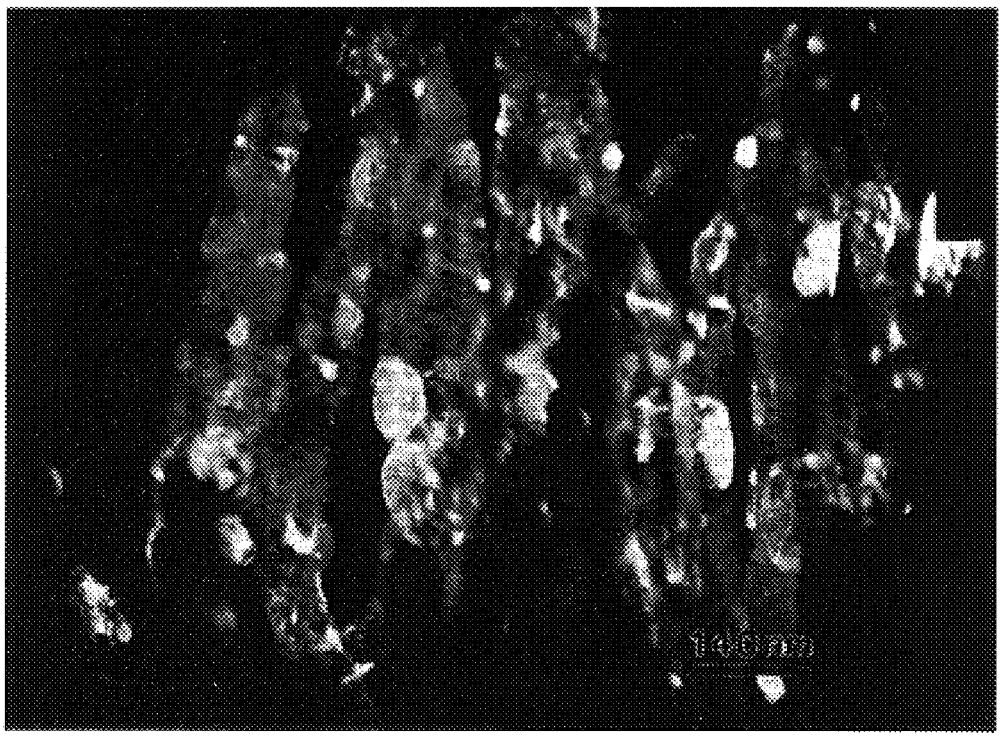
Figure 14A:
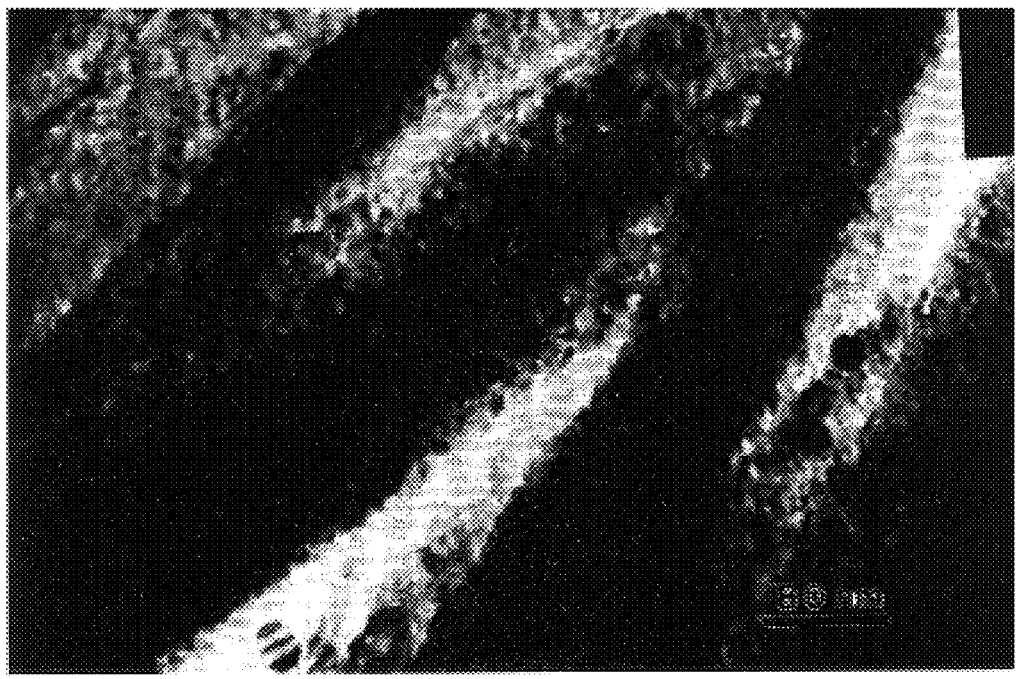
FIGS. 14A–14B are TEM photographs of the BSTO product microstructure formed by using octadecylamine as the organic template.
Figure 14B:
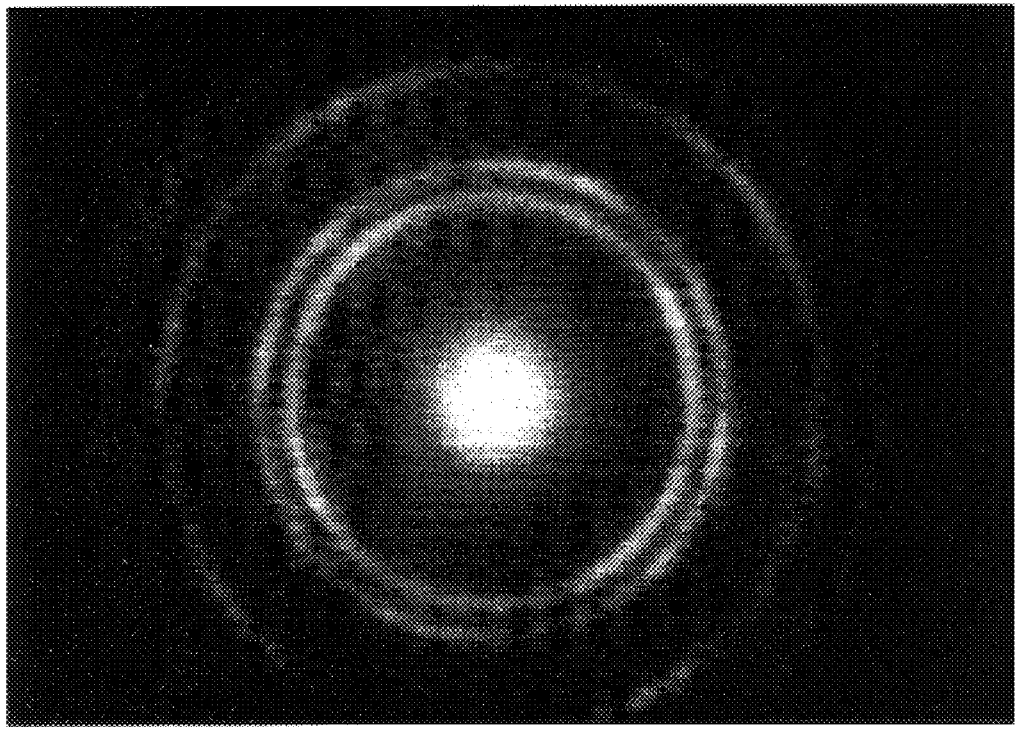
Figure 15A:
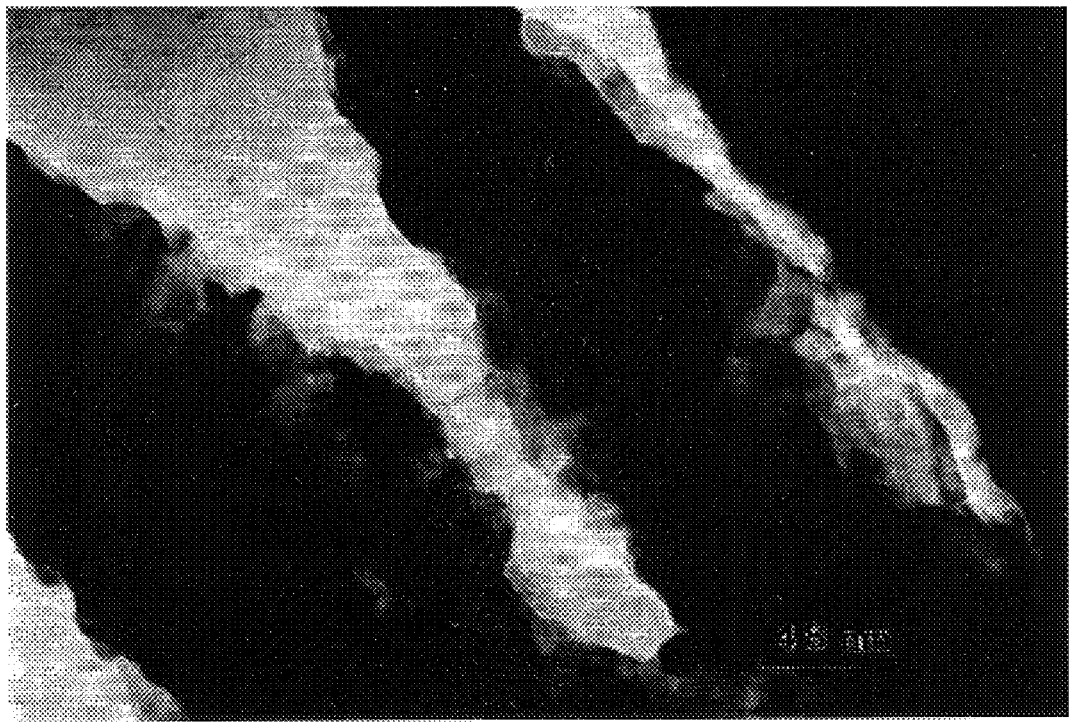
FIGS. 15A–15B are TEM photographs of the BSTO product microstructure formed by using N-octadecyl phosphonic as the organic template.
Figure 15B:
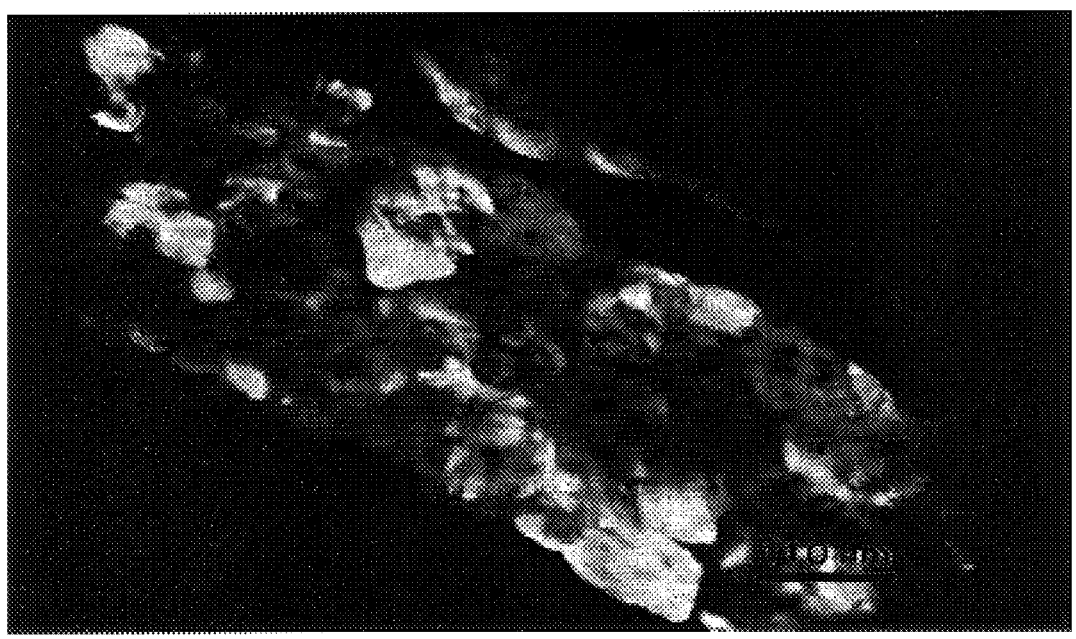

FIGS. 11–12 are energy dispersive X-ray spectra of BSTO grown under: (a) $C_{16}ISA$ (FIG. 11); and (b) octadecylamine (FIG. 12). These spectra indicate about equal content of all elements in BSTO, under different processing.

FIGS. 13A–13B, 14A–14B and 15A–15B are additional TEM photographs of three BSTO products formed with the following functional groups, respectively: $C_{16}ISA$; octadecylamine; and N-octadecyl phosphonic.

Having thus described certain embodiments of the invention, modifications thereof will be readily apparent to those skilled in the art which are intended to be included in the following claims.

We claim:

1. A process for controlling the formation of a ceramic comprising the steps of:

preparing a crystallization medium of a ceramic parent solution, the solution having an air-liquid interface; and forming an organic monolayer on the air-liquid interface of the solution, wherein the organic monolayer comprises a hydrogen-bonded network having a periodicity approximately matching an inter-ion distance in a crystal plane of the ceramic.

2. The process of claim 1, wherein the organic monolayer comprises an isophthalic acid.

3. The process of claim 2, wherein the isophthalic acid is 5-hexadecyloxyisophthalic acid.

4. The process of claim 1, wherein the ceramic is aragonite, the crystallization medium is undoped calcium bicarbonate solution; and the structural motif is approximately matching a calcium ion distance in an a-c plane of aragonite.

5. The process of claim 4, wherein the undoped calcium bicarbonate solution is prepared by:

purging $CO_2$ gas through a suspension of calcium carbonate in de-ionized water;

filtering the suspension; and purging $CO_2$ gas through the suspension.

6. The process of claim 4, wherein the calcium bicarbonate solution has a pH of from about 5.8 to about 6.0.

7. The process of claim 6, wherein the calcium bicarbonate solution has a calcium ion concentration of about 9.0 to about 9.5 mM.

8. The process of claim 7, wherein the organic monolayer is spread on the air-liquid interface under a pressure of about 10 to about 15 mN/m.

9. The process of claim 1, wherein the process is conducted under ambient conditions.

10. The process of claim 1, wherein:

the monolayer is formed by spreading a solubilized organic molecule on a water surface of a trough; and compressing the organic molecules on the water surface to form the monolayer.

11. The process of claim 10, wherein the organic molecule is isophthalic acid.

12. The process of claim 11, wherein the isophthalic acid is 5-hexadecyloxyisopthalic acid.

13. A process for controlling the formation of aragonite comprising the steps of:

forming a template structure having a periodicity approximately matching a calcium ion distance in an a-c plane of aragonite; and forming aragonite at a surface of the template structure.

14. The process of claim 13, wherein the step of forming the template structure includes forming a monolayer at an air-water interface of a crystallization medium.

15. The process of claim 14, wherein the monolayer is formed from an organic molecule.

16. The process of claim 15, wherein the crystallization medium is an undoped calcium solution.

17. The process of claim 16, wherein the undoped calcium carbonate solution is prepared by:

purging $CO_2$ gas through a suspension of calcium carbonate in de-ionized water;

filtering the suspension; and purging $CO_2$ gas through the suspension.

18. A process for controlling the microstructure of perovskite ceramic materials comprising the steps of:

preparing a crystallization medium of a perovskite parent solution, the solution having an air liquid interface; and forming an organic monolayer on the air-liquid interface of the solution, wherein the organic monolayer comprises a hydrogen-bonded network having a periodicity approximately matching an inter-ion distance in a crystal plane of the ceramic.

19. The process of claim 18, wherein the perovskite ceramic material is barium strontium titanium oxide (BSTO).

20. The process of claim 19, wherein the organic monolayer comprises 5-hexadecyloxyisophthalic acid.

21. The process of claim 19, wherein the organic monolayer comprises octadecylamine.

22. The process of claim 19, wherein the organic monolayer comprises sphingomyelin.

23. The process of claim 19, wherein the process is conducted under ambient conditions.

* * * * *

UNITED STATES PATENT AND TRADEMARK OFFICE
CERTIFICATE OF CORRECTION

PATENT NO. : 5,993,541
DATED : November 30, 1999
INVENTOR(S) : Arkadi L. Litvin et al.

It is certified that error appears in the above-identified patent and that said Letters Patent is hereby corrected as shown below:

On the title page:

Please add the following data:

Assignee: Geo-Centers, Inc., and Government of the United States/Department of the Army Attorney, Agent, or Firm: Vincent J. Ranucci, U.S. Army; and Wolf, Greenfield & Sacks, P.C.

Col. 1, line 4:

Please insert before <u>Field of the Invention</u> section -- The invention described herein may be manufactured, used and licensed by or for the U.S. Government for U.S. Governmental purposes without the payment to us of any royalty thereon. This invention was developed under contract with the U.S. Army Soldier Systems Command, Natick Research, Development and Engineering Center, Natick, MA 01760. --

Signed and Sealed this

Twenty-ninth Day of August, 2000

Attest:

Attesting Officer

Q. TODD DICKINSON
*Director of Patents and Trademarks*